United States Patent [19]
Lee et al.

[11] Patent Number: 5,870,041
[45] Date of Patent: Feb. 9, 1999

[54] ANALOG-TO-DIGITAL CONVERTER WITH DIGITAL COMPENSATION

[75] Inventors: Seong-Ho Lee, Bucheon; Euro Joe, Seoul, both of Rep. of Korea

[73] Assignee: Samsung Electronics, Co., Ltd., Suwon, Rep. of Korea

[21] Appl. No.: 773,481

[22] Filed: Dec. 23, 1996

[30] Foreign Application Priority Data

Dec. 23, 1995 [KR] Rep. of Korea ................. 1995-55600

[51] Int. Cl.⁶ ............................................... H03M 1/06
[52] U.S. Cl. ........................................ 341/118; 341/162
[58] Field of Search ................................. 341/118, 161, 341/162, 163

[56] References Cited

U.S. PATENT DOCUMENTS 5,017,920  5/1991  French ..................................... 341/162
5,635,937  6/1997  Lim et al. ................................ 341/118

Primary Examiner—Howard L. Williams
Attorney, Agent, or Firm—Marger, Johnson & McCollom, P.C.

[57] ABSTRACT

A digitally compensated analog-to-digital converter (ADC) provides improved linearity by generating calibration values having higher resolution than the output signal generated during a normal conversion. During a calibration value generation operation, the converter performs a normal conversion, then performs an additional conversion, thereby generating a high resolution calibration value which is then rounded and stored in a memory device. The converter includes a flash ADC which converts an analog input signal received through a multiplexer and sample-hold amplifier to a digital signal. The flash ADC provides control signals to a multibit digital-to-analog converter which generates the analog reconfiguration signal during multi-stage conversions. A digital correction circuit receives the digital signals from several multi-stage conversion and generates a corrected signal. A digital calibration circuit stores the rounded calibration values during a calibration value generation operation and generates a digital calibration signal which is added to the corrected signal during a normal operation to generate a digitally compensated signal.

22 Claims, 4 Drawing Sheets

Operation of the first MDAC when normally operated when 5-bit DIN = 0 when 5-bit DIN = 1

⋮ when 5-bit DIN = 31

Operation of the first MDAC when generating calibration value when evaluating e1 when evaluating e2

⋮ when evaluating e31

(e1, e2, ..., e31 represent the amounts of the errors of C1, C2, ..., C31)

ANALOG-TO-DIGITAL CONVERTER WITH DIGITAL COMPENSATION

This application corresponds to Korean Patent application No. 95-55600 filed Dec. 23, 1995 in the name of Samsung Electronics Co. Ltd., and incorporated herein by reference.

BACKGROUND OF THE INVENTION

1. Field of the Invention

This invention relates generally to analog-to-digital converters and more particularly to a digital compensation type analog-to-digital converter which can calculate circulation type self calibration values with improved accuracy.

2. Description of the Related Art

The digitalization of audio and video appliances has increased the demand for high-speed and high-resolution analog-to-digital converters (A/D converters). In order to perform high resolution conversions, A/D converters have been implemented utilizing multistage converters. A multibit digital-to-analog converter (MDAC) is used to implement a multistage converter. However, the linearity characteristics of the entire converter are likely to deteriorate if any mismatch exists in the MDAC. Thus, self calibration techniques have been used to correct errors caused by the mismatch in the MDAC.

In a conventional self calibration technique, calibration values are generated through the same process as the normal conversion of the A/D converter. In such a process, if the amount of error in the MDAC is large, the generated calibration values correctly correspond to the actual values of the errors. However, if the error is small, correct calibration may not be effected. For example, if a positive error exists, the actual A/D-converted error value might be "0011111" in view of the characteristics of the A/D converter, even though this error value should be converted to "0100000" to be stored in memory. Consequently, the error value generated during the calibration value creating process is larger than the existing error value.

More specifically, there may be two elements of the A/D converter, each of which has an associated error. The A/D converter may determine that the error value for each of the elements is −1, even though each error value is actually close to "0" when the reference error is set to "0100000". If the two elements having respective errors are used separately in the A/D converter, the determined error value does not matter much since the incorrectly determined error value does not cause the A/D converter to exceed a predetermined nonlinearity limit. However, if the two elements are used simultaneously, the error value is determined to be "−2" as the sum of the two errors, rather than "−1" which is the true error. Thus, the predetermined nonlinearity limit is exceeded.

Such inaccurately determined error values do not matter much with respect to each individual calibration value. However, when they are summed together to perform self-calibration, the determined errors become greater than the existing errors, and as a result, the calibration process itself becomes useless.

Accordingly, a need remains for a technique for determining calibration values for an A/D converter which overcomes the problems mentioned above.

SUMMARY OF THE INVENTION

Therefore, it is an object of the present invention to improve the accuracy of a digitally compensated A/D converter.

A further object of the present invention is to improve the linearity of a digitally compensated A/D converter.

To accomplish these and other objects, an A/D converter in accordance with the present invention calculates calibration values having higher resolution than the normal conversion data. During a calibration value generation operation, the converter performs a normal conversion, then performs an additional conversion, thereby generating a high resolution calibration value which is then rounded and stored in a memory device. The converter includes a flash A/D converter which converts an analog input signal received through a multiplexer and sample-hold amplifier to a digital signal. The flash A/D converter provides control signals to a multiplying digital-to-analog converter which generates the analog reconfiguration signal during multi-stage conversions. A digital correction circuit receives the digital signals from several multi-stage conversion and generates a corrected signal. A digital calibration circuit stores the rounded calibration values during a calibration value calculation operation and generates a digital calibration signal which is added to the corrected signal during a normal operation to generate a digitally compensated signal.

One aspect of the present invention is a digitally compensated analog-to-digital converter system which includes a first selector for selecting either an analog input signal or an analog reconfiguration signal responsive to a second clock signal, thereby generating a selected signal. A sample-and-hold circuit is coupled to the selector to sample and hold the selected signal, thereby generating a held signal. An analog-to-digital converter is coupled to the sample-and-hold circuit to convert the held signal to a digital signal. The analog-to-digital converter also generates a digital control signal. A digital-to-analog converter is coupled to the selector to generate the reconfiguration signal in response to a second selected signal. A second selector is coupled between the analog-to-digital converter and the digital-to-analog converter to select either the digital control signal or a conversion control signal, thereby generating the second selected signal. A calibration circuit is coupled to the analog-to-digital converter to store a portion of the digital signal as a calibration value and generate a digital calibration signal. An adder is coupled between the analog-to-digital converter and the calibration circuit to add the digital signal and the digital calibration signal, thereby generating a digitally compensated signal. A controller controls the entire system such that the corrected digital signal has a higher resolution during a calibration value calculation operation than during a normal operation.

Another aspect of the present invention is a method of operating a digitally compensated analog-to-digital converter comprising: performing a normal conversion process, then performing an additional conversion process, thereby generating a calibration value having a higher resolution than a value generated by the normal conversion process.

The foregoing and other objects, features and advantages of the invention will become more readily apparent from the following detailed description of a preferred embodiment of the invention which proceeds with reference to the accompanying drawings.

DETAILED DESCRIPTION

Figure 1:
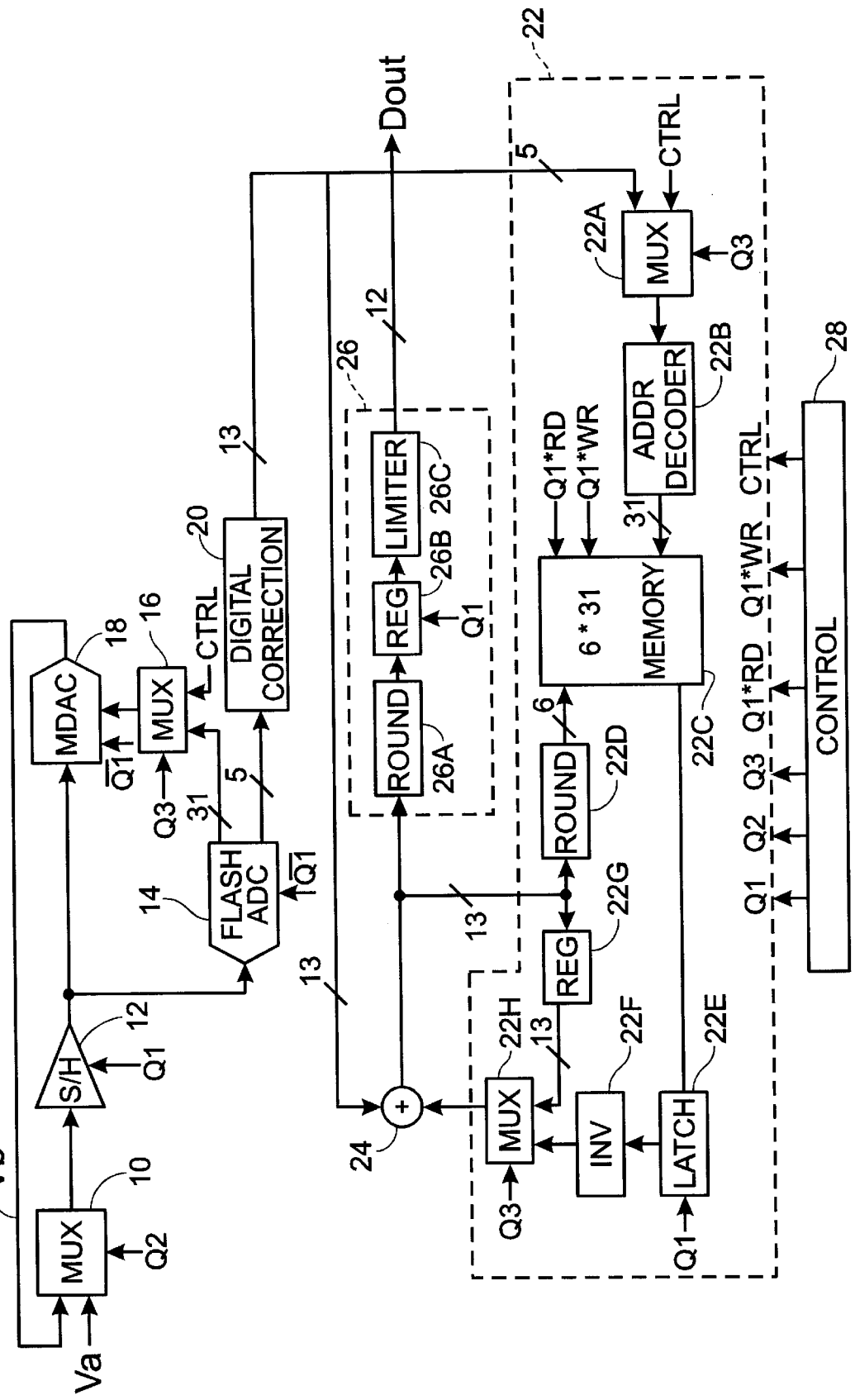
FIG. 1 is block diagram of an embodiment of an analog-to-digital converter in accordance with the present invention.

Referring to FIG. 1, an embodiment of an A/D converter according to the present invention includes a first selection section 10, a sample-and-hold section 12, a flash analog-to-digital converter 14, a second selection section 16, a multibit digital-to-analog converter (MDAC) 18, a digital correction section, a digital calibration section 22, an adder 24, an output section 26, and a control section 28.

The first selection section 10 includes a multiplexer which selects an analog input signal Va when a second clock signal Q2 is at a high logic level, and selects an analog reconfiguration signal Vb when the second clock signal Q2 is at a low logic level.

The sample-and-hold section 12 samples the analog signal input thereto in response to a first clock signal Q1 when a first clock signal Q1 is at a high logic level, and then holds the sampled signal when the first clock signal Q1 is at a low logic level.

The flash A/D converter 14 converts the held signal to a digital signal in response to a high logic level on an inverted first clock signal Q1-bar and generates a 5-bit digital signal and a 31-bit digital control signal.

The second selection section 16 selects the control signal provided from the flash A/D converter 14 when a third clock signal Q3 is at a high logic level, and selects the conversion control signal CTRL provided from the control section 28 when the third clock signal Q3 is at a low logic level.

The MDAC 18 reconfigures the held signal which is provided from the sample-and-hold section 12 in accordance with the control signal selected by the second selection section 16, in response to a high logic level on the inverted first clock signal Q1-bar and generates the analog reconfiguration signal Vb.

The digital correction section 20 receives and digitally corrects the 5-bit digital signal provided from the flash A/D converter 14 and generates a corrected 13-bit digital signal.

The digital calibration section 22 generates a digital calibration signal which corresponds to the upper 5-bits of the 13-bit corrected digital signal in response to the first and the third clock signals Q1 and Q3.

The adding section 24 adds the 13-bit corrected digital signal and a 6-bit digital calibration signal and generates a 13-bit digitally compensated signal.

The output section 26 processes the digitally compensated signal in response to the first clock signal Q1 and generates a 12-bit final converted digital signal.

The control section 28 controls the first and the second selection sections 10 and 16 during the calibration value calculating operation so that the 13-bit digitally compensated signal, which has a higher resolution than a 9-bit output digital signal during the normal operation of the converter, is detected and generated. The control section 28 also generates the first, second and third clock signals Q1, Q1-bar, Q2, and Q3, and the control signals CTRL, Q1*RD, and Q1*WR so that the detected digitally compensated signal is stored in the digital calibration section 22.

The digital calibration section 22 includes a third selection section 22A, an address decoder 22B, a 6-by-31 memory 22C, a first round-off section 22D, a latch 22E, an inverter 22F, a first register 22G, and a fourth selection section 22H.

The third selection section 22A selects either the upper 5-bits of the 13-bit corrected digital signal or the control signal CTRL provided from the control section 28 in response to the third clock signal Q3. Address decoder 22B decodes the signal selected by the third selection section 22A and generates a 31-bit address signal. The 6-by-31 memory 22C stores the 6-bit digitally compensated value at an address which is determined by the address signal in response to a write control signal Q1*WR. Memory 22C reads out the 6-bit digitally compensated value stored therein in response to a read control signal Q1*RD.

The first round-off section 22D rounds off the 13-bit digitally compensated signal provided from the adding section 24 and provides the 6-bit digitally compensated value to the memory 22C. Latch 22E latches the 6-bit digitally compensated value read out from the memory 22C, while inverter 22F inverts the output of the latch 22E. The first register 22G stores the 13-bit digital signal provided from the adding section 24 in response to the first clock signal Q1. The fourth selection section 22H selects either the output signal from the inverter 22F or the output signal from the first register 22G in response to the third clock signal Q3.

The output section 26 includes a second round-off section 26A for rounding off the 13-bit digitally compensated signal, a second register 26B for storing the output signal from the second round-off section 26A in response to the first clock signal Q1, and a limiter 26C for limiting the output signal from the second register 26B and providing the 12-bit final converted digital signal.

In order to reduce the errors caused by the conventional calibration technique, an A/D converter in accordance with the present invention provides more accurate and elaborate calibration values than prior art converters by performing an additional conversion process. A conventional two-stage A/D converter generates calibration values by performing a conversion of the second stage only. Likewise, a conventional three-stage A/D converter generates calibration values by performing a conversion of only the lower two stages.

In contrast, an A/D converter in accordance with the present invention performs an additional conversion after the normal conversion process. Thus, an additional conversion is performed after the least significant bit conversion. For example, an A/D converter in accordance with the present invention, which normally performs a two-stage conversion, generates calibration values by performing a three-stage conversion.

In a preferred embodiment, the 5-bit conversion process is performed three times to generate the 12-bit converted output signal. A 9-bit converted signal is obtained by performing the 5-bit conversion process twice after the conversion process is performed by the MDAC 18. In the conventional calibration method, the converted values are obtained by a 9-bit operation after a 9-bit conversion is performed. However, according to the present invention, a 13-bit conversion (the activity of transforming an analog signal into a digital signal) is performed in the calibration value calculation process, and then a 13-bit operation (an arithmetical operation between an output code from the conversion and a calibration value) is performed. The 13-bit calibrated value is not stored as a whole, but is stored in the memory as a value of about 9 bits. The 13-bit calibration value is rounded off to a value of about 9-bits.

For example, if the error-converted output of 13 bits corresponds to "001111110010", the error value of "−1" which is obtained by rounding off this output value is stored in the first memory as well as the error value of "−1" which is the sum of the two error values. Although the individual error value of the two elements being stored in the memory is the same as in the conventional calibration technique, the sum of the errors of the two elements obtained by the present invention is closer to the existing error in comparison to that obtained by the conventional method.

In creating the calibrated value, performing the additional conversion process enables a more accurate A/D-converted output to be obtained in comparison with the conventional calibration method.

More detailed consideration will now be given to the operation of a digital compensation type A/D converter in accordance with the present invention with reference to FIGS. 1, 2 and 3.

Figure 2:
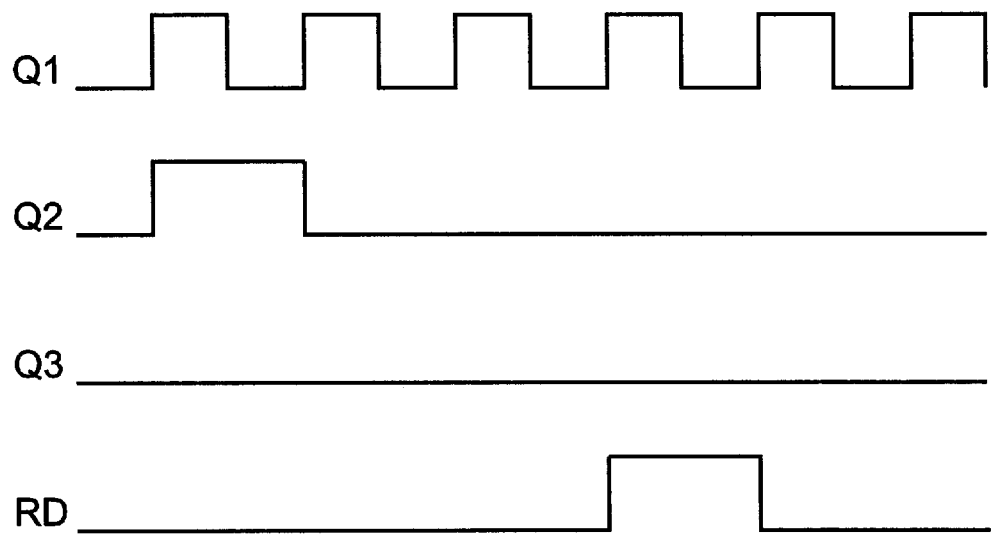
FIG. 2 is a timing diagram illustrating the normal operation of the analog-to-digital converter of FIG. 1.
Figure 3:
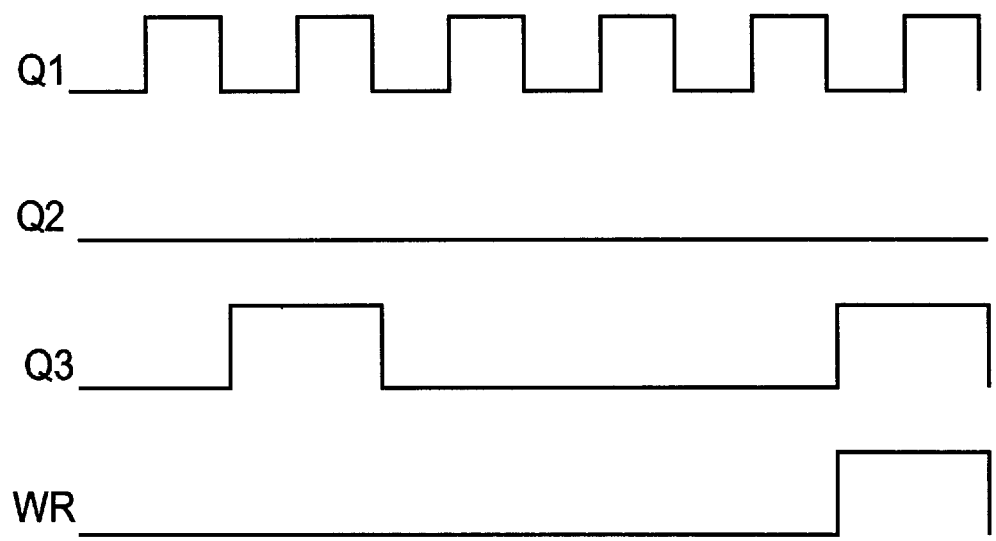
FIG. 3 is a timing diagram illustrating the calibration value calculation operation of the analog-to-digital converter of FIG. 1.

Referring to FIGS. 2 and 3, the first selection section 10 selects the input analog signal Va when the clock signal Q2 is in a "1" state, and it selects the output Vb of the MDAC 18 when the clock signal Q2 is in a "0" state. The sample-and-hold section 12 performs sampling when the clock signal Q1 is in a "1" state, while it holds the sampled signal when the clock signal Q1 is in a "0" state. The flash A/D converter 14 converts the input signal to a digital signal when the clock signal Q1 is in a "0" state, and it outputs the converted digital signal when the clock signal Q1 is in a "1" state. The MDAC 18 determines the difference between the analog signal input and the 31-bit control signal, and amplifies the difference value. During normal operation, the clock signal Q3 is in a "0" state, and the MDAC 18 is controlled by the output of the flash A/D converter 14.

The flash A/D converter 14 generates a 5-bit converted digital signal. The 5-bit conversion process as described above is repeated three times to generate the 12-bit converted output signal. The whole 15-bits of converted digital data passes first through the correction process and then through the calibration process. During the calibration process, the final calibrated digital signal is generated by subtracting the calibrated value stored in the memory from the corrected digital signal. At this time, addresses of the memory in which the calibrated values are stored are determined by using the upper 5 bits of the output signal from the digital correction section 20. The 13-bit calibration value is rounded off to a value of about 9-bits.

The calibration value calculation process performed by a three-stage A/D converter in accordance with the present invention will now be explained in more detail. Referring to FIG. 3, addresses of the MDAC 18 and the memory 22C are determined by the control signal CTRL generated by the control section 28. The generation of the calibration value begins with a measurement of the errors existing among passive elements in the MDAC 18. The MDAC 18 is controlled by the control section 28, and provides the reconfiguration signal. The reconfiguration signal then passes through the two-stage conversion process which follows the path of the sample-and-hold section 12, flash A/D converter 14, MDAC 18, sample-and-hold section 12, and flash A/D converter 14 to obtain the 9-bit converted digital signal. During the two-stage conversion, the calibration values are obtained by generating and accumulating the error values of the respective elements. The calibration values are then stored in the memory 22C.

If the calibration value calculation process were to be stopped at this point, the 9-bit data obtained by the accumulation would have the problem as previously described with respect to the prior art. However, in accordance with the present invention, an additional conversion which follows the path of the MDAC 18, sample-and-hold section 12, and flash A/D converter 14 is performed.

The calibrated value obtained by the three-stage conversion has an accuracy of 17 bits, while that obtained by the normal conversion has a 12-bit resolution. However, in a practical application, such a large number of bits are not required for the calibration process. Thus, the 17-bit calibrated value is rounded off to a value of about 13 bits with the remaining bits thrown out, thereby reducing excessive use of the memory.

More detailed consideration will now be given to the theory of operation of the present invention as it relates to an analog-to-digital convertor ("ADC") which obtains a 13-bit output by performing three 5-bit conversion processes in each step. In this type of ADC, a multibit digital-to-analog convertor ("MDAC") is used to obtain a second 5-bits after obtaining a first 5-bits, and the MDAC generally comprises a capacitor and an amplifier. Although the capacitor has the best matching property among devices which can be made by semiconductor fabricating processes, the capacitor is insufficient to satisfy high-resolution requirements for more than 12-bits, and linearity error occurs according to the matching property of a capacitor when realizing the ADC. In order to reduce the error due to this capacitor mismatch, a calibration process is implemented.

A 5-bit MDAC comprises 33 capacitors, each of which is switched according to a digital code input and 1 differential amplifier, and linearity error is changed in accordance with changes in the matching property of each capacitor. In the process of generating calibration values, the matching errors of the capacitors are measured, and digital outputs corresponding to the amounts of the errors are stored in a memory. However, the calibration value generating operation of the MDAC is different from that of the ADC when the ADC is operated in a normal mode. Two operations of the MDAC are shown in the enclosed FIGS. 4 and 5.

Figure 4:
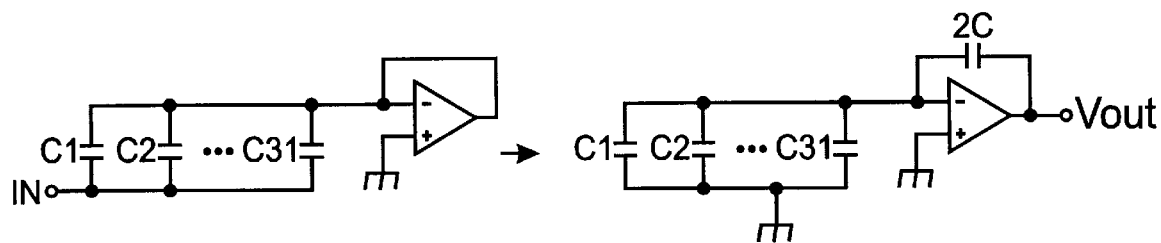
FIG. 4 is a drawing illustrating the operation of the MDAC of FIG. 1 during a normal operation.
Figure 4:
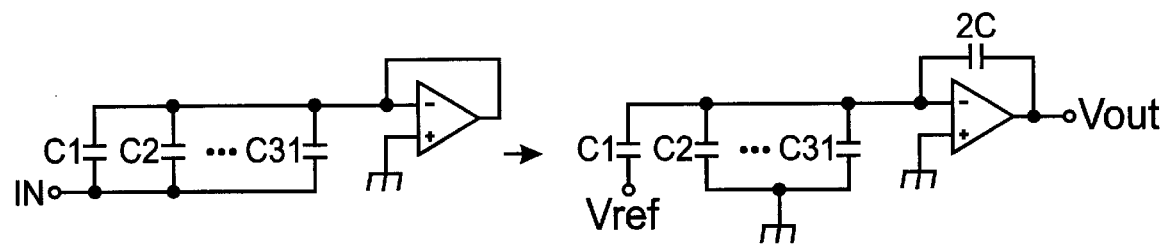
Figure 4:
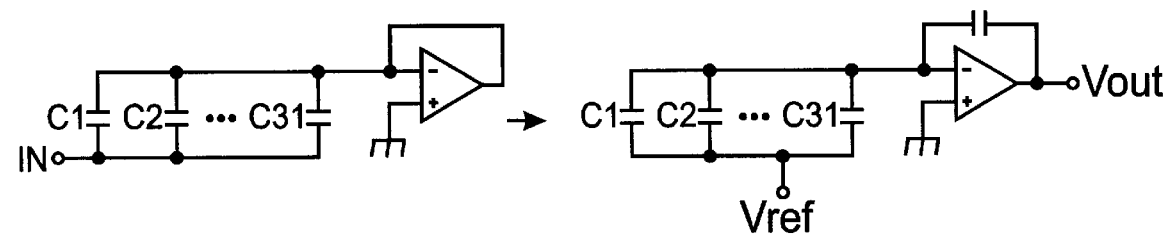
Figure 5:
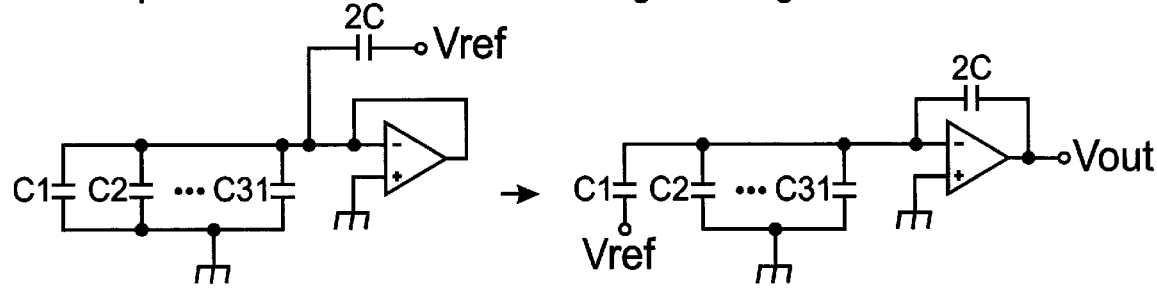
FIG. 5 is a drawing illustrating the operation of the MDAC of FIG. 1 during a calibration value generation operation.
Figure 5:
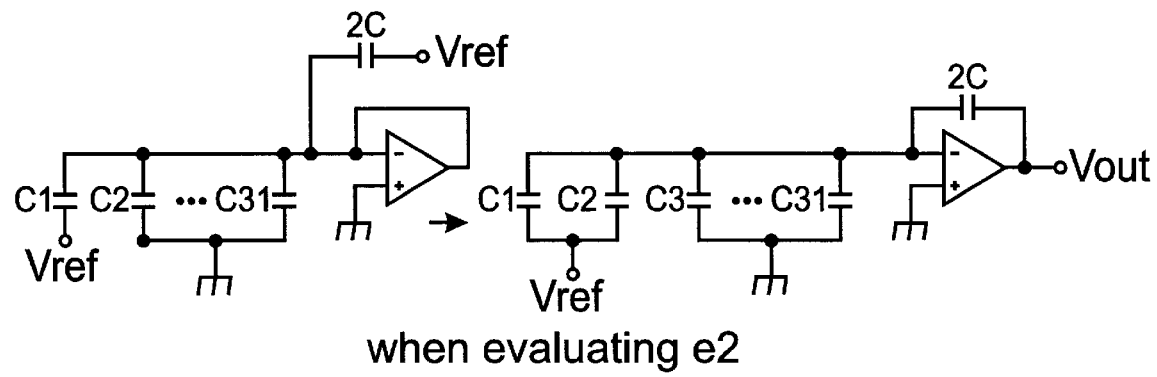
Figure 5:
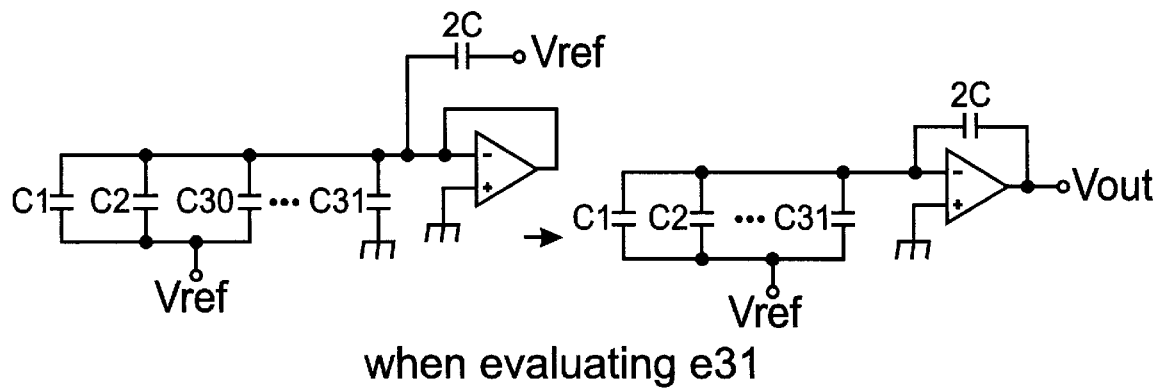

In order to obtain the amounts of errors in normal operation as illustrated in FIG. 4 by using calibration values generation as illustrated in FIG. 5, errors for respective capacitors are to be summed. That is, when $e1, e2, \ldots, e31$ denote errors of $C1, C2, \ldots, C31$ and $E1, E2, \ldots, E31$ denote errors stored in 31 memories, respectively, the equalities of $E1=e1$, $E2=e1+e2$, $E3=e1+e2+e3$, $\ldots$, $E31=e1+e2+\ldots+e31$ are defined. When deliberating the above-mentioned calibration process, it is to be understood that the conventional method performs two 5-bit conversions and one 9-bit conversion for the error of the capacitor produced in the first MDAC, and the present method performs three 5-bit conversions and one 13-bit conversion for it. Now, referring to the following example, the methods of the prior art and the present invention will be compared with each other:

010000001("01000010000000" in 13-bit code)

reference of calibration value ("0" error level)

-010000000("0100000000000" in 13-bit code)

measured error during calibration value generation

001111111("0011111110000" in 13-bit code)

If two errors of C1 and C2 are equal to the "measured error" of the above example, "001111111" is obtained by performing a 9-bit conversion. Accordingly:

$$
\begin{aligned}
e1 = e2 &= \text{``001111111'' $-$ ``010000000''} \\
&= \text{``001111111'' $+$ 2's complement of``010000000''} \\
&= \text{``001111111'' $+$ ``110000000''} \\
&= \text{``111111111''}
\end{aligned}
$$

and E1="−1", E2="−2". However, contrary to the fact that E2 must be 2±e1 when e1=e2, it is reasonable for E2 in this case to be "−1" rather than "−2", when referring to the above example.

In the present invention, a 13-bit A/D conversion for error of capacitor measured upon calibration value generation is performed so as to reduce the difference between error conversion and error accumulation. If "0011111111000" is output when the "measured error" of the above example is 13-bit converted, e1 and e2 can be designated as follows:

$$
\begin{aligned}
e1 = e2 &= \text{``0011111111000'' $-$ ``0100000000000''} \\
&= \text{``0011111111000'' $-$ 2's complement of``0100000000000''} \\
&= \text{``0011111111000'' $+$ ``1100000000000''} \\
&= \text{``1111111111000''}
\end{aligned}
$$

and E1 stored in the memory equals to the value which is obtained by rounding off e1 in 9-bit level, that is, "−1" and E2 stored in the memory equals to the value which is obtained by rounding off "e1+e2" ("1111111111000"+ 1111111111000"="1111111110000") in 9-bit level, that is "−1".

When comparing the conventional method with the method of the present invention for E1 and E2 which are to be used as a calibration value when ADC is operated normally, it is to be readily understood that the conventional method and method of the present invention reveal the same result in case of E1 but the method of the present invention has a more accurate approximate value than the conventional method in case E2.

Although rounding off in 9-bit level is implemented as mentioned above, because the matching error of the capacitor is very small, an accumulated error for each code is only represented by changed amount of lower bit. Accordingly, because it is possible to know sign (+,−) and value of the amount of error, the value stored in the memory is lower 6 bit, and when using calibration value thereof during normal operation, 6-bit data is expanded to 13-bit to be used in arithmetical operation.

From the foregoing, it will be apparent that the digital compensation type A/D converter according to the present invention provides a converted digital output signal that has improved linearity in comparison to a conventional A/D converter. Further, an A/D converter according to the present invention may be easily adapted to a circulation type A/D converter.

Having described and illustrated the principles of the invention in a preferred embodiment thereof, it should be apparent that the invention can be modified in arrangement and detail without departing from such principles. We claim all modifications and variations coming within the spirit and scope of the following claims.

We claim:

1. A digitally compensated analog-to-digital converter system comprising:
   a first selector for selecting either an analog input signal or an analog reconfiguration signal responsive to a second clock signal, thereby generating a selected signal;
   a sample-and-hold circuit coupled to the selector to sample and hold the selected signal, thereby generating a held signal;
   an analog-to-digital converter coupled to the sample-and-hold circuit to convert the held signal to a digital signal, the analog-to-digital converter generating a digital control signal;
   a digital-to-analog converter coupled to the selector to generate the reconfiguration signal responsive to a second selected signal;
   a second selector coupled between the analog-to-digital converter and the digital-to-analog converter to select either the digital control signal or a conversion control signal, thereby generating the second selected signal;
   a calibration circuit coupled to the analog-to-digital converter for calculating a calibration value based on the digital signal and generating a digital calibration signal;
   an adder coupled between the analog-to-digital converter and the calibration circuit to add the digital signal and the digital calibration signal, thereby generating a digitally compensated signal; and
   a controller coupled to the first selector, the sample-and-hold circuit, the analog-to-digital converter, the digital-to-analog converter, the second selector, and the calibration circuit;
   wherein the controller controls the system such that the digital signal has a higher resolution during a calibration value calculation operation than during a normal operation.

2. A system according to claim 1 further including a digital corrector coupled to the analog-to-digital converter to correct the digital signal, thereby generating a corrected digital signal.

3. A system according to claim 1 wherein the calibration circuit includes a memory device coupled to the adder, the memory device storing the calibration value during a calibration value calculation operation and retrieving the calibration value during a normal operation.

4. A system according to claim 3 wherein the calibration circuit further includes an address decoder coupled to the memory device to generate an address signal responsive to the digital signal.

5. A system according to claim 4 wherein the calibration circuit further includes a third selector coupled between the address decoder and the analog-to-digital converter to selectively couple either the digital signal or the conversion control signal to the address decoder.

6. A digitally compensated analog-to-digital converter system comprising:
   a first selector for selecting either an analog input signal or an analog reconfiguration signal responsive to a second clock signal, thereby generating a selected signal;
   a sample-and-hold circuit coupled to the selector to sample and hold the selected signal, thereby generating a held signal;
   an analog-to-digital converter coupled to the sample-and-hold circuit to convert the held signal to a digital signal, the analog-to-digital converter generating a digital control signal;
   a digital-to-analog converter coupled to the selector to generate the reconfiguration signal responsive to a second selected signal;
   a second selector coupled between the analog-to-digital converter and the digital-to-analog converter to select either the digital control signal or a conversion control signal, thereby generating the second selected signal;
   a calibration circuit coupled to the analog-to-digital converter to store a portion of the digital signal as a calibration value and generate a digital calibration signal;

an adder coupled between the analog-to-digital converter and the calibration circuit to add the digital signal and the digital calibration signal, thereby generating a digitally compensated signal; and a controller coupled to the first selector, the sample-and-hold circuit, the analog-to-digital converter, the digital-to-analog converter, the second selector, and the calibration circuit;

wherein the controller controls the system such that the digital signal has a higher resolution during a calibration value calculation operation than during a normal operation; and further including an output circuit coupled to the adder to processes the digitally compensated signal, thereby generating a converted digital output signal.

7. A system according to claim 6 wherein the output circuit includes:
   a rounder coupled to receive the digitally compensated signal;
   a register coupled in series with the rounder; and
   a limiter coupled in series with the register.

8. A digitally compensated analog-to-digital converter system comprising:
   a first selector for selecting either an analog input signal or an analog reconfiguration signal responsive to a second clock signal, thereby generating a selected signal;
   a sample-and-hold circuit coupled to the selector to sample and hold the selected signal, thereby generating a held signal;
   an analog-to-digital converter coupled to the sample-and-hold circuit to convert the held signal to a digital signal, the analog-to-digital converter generating a digital control signal;
   a digital-to-analog converter coupled to the selector to generate the reconfiguration signal responsive to a second selected signal;
   a second selector coupled between the analog-to-digital converter and the digital-to-analog converter to select either the digital control signal or a conversion control signal, thereby generating the second selected signal;
   a calibration circuit coupled to the analog-to-digital converter to store a portion of the digital signal as a calibration value and generate a digital calibration signal;
   an adder coupled between the analog-to-digital converter and the calibration circuit to add the digital signal and the digital calibration signal, thereby generating a digitally compensated signal; and
   a controller coupled to the first selector, the sample-and-hold circuit, the analog-to-digital converter, the digital-to-analog converter, the second selector, and the calibration circuit;
   wherein the controller controls the system such that the digital signal has a higher resolution during a calibration value calculation operation than during a normal operation;
   wherein the calibration circuit includes a memory device coupled to the adder, the memory device storing the calibration value during a calibration value calculation operation and retrieving the calibration value during a normal operation; and
   wherein the calibration circuit further includes a rounder coupled between the adder and the memory device to round the digitally compensated signal.

9. A digitally compensated analog-to-digital converter system comprising:
   a first selector for selecting either an analog input signal or an analog reconfiguration signal responsive to a second clock signal, thereby generating a selected signal;
   a sample-and-hold circuit coupled to the selector to sample and hold the selected signal, thereby generating a held signal;
   an analog-to-digital converter coupled to the sample-and-hold circuit to convert the held signal to a digital signal, the analog-to-digital converter generating a digital control signal;
   a digital-to-analog converter coupled to the selector to generate the reconfiguration signal responsive to a second selected signal;
   a second selector coupled between the analog-to-digital converter and the digital-to-analog converter to select either the digital control signal or a conversion control signal, thereby generating the second selected signal;
   a calibration circuit coupled to the analog-to-digital converter to store a portion of the digital signal as a calibration value and generate a digital calibration signal;
   an adder coupled between the analog-to-digital converter and the calibration circuit to add the digital signal and the digital calibration signal, thereby generating a digitally compensated signal; and
   a controller coupled to the first selector, the sample-and-hold circuit, the analog-to-digital converter, the digital-to-analog converter, the second selector, and the calibration circuit;
   wherein the controller controls the system such that the digital signal has a higher resolution during a calibration value calculation operation than during a normal operation;
   wherein the calibration circuit includes a memory device coupled to the adder, the memory device storing the calibration value during a calibration value calculation operation and retrieving the calibration value during a normal operation; and
   wherein the calibration circuit further includes:
      a register coupled to the adder to generate a registered signal responsive to the digitally compensated signal; and
      a fourth selector coupled to the adder, the register, and the memory device to selectively couple either the registered signal or an output signal from the memory device to the adder.

10. A system according to claim 9 wherein the calibration circuit further includes:
   a latch coupled to the memory device to latch the calibration value from the memory device; and
   an inverter coupled between the latch and the fourth selector.

11. A digitally compensated analog-to-digital converter comprising:
   first selection means for selecting either an input analog signal or an analog reconfiguration signal in response to a second clock signal;
   sample-and-hold means for sampling the signal selected by said first selection means and holding a sampled signal in response to a first clock signal;
   an analog-to-digital converter for converting a held signal from said sample-and-hold means to a digital signal in response to the first clock signal;

second selection means for selecting either said digital signal or a control signal in response to a third clock signal;

a multibit digital-to-analog converter for reconfiguring said held signal in response to the signal selected by said second selection means in response to the first clock signal, thereby generating said analog reconfiguration signal;

digital correction means for digitally correcting said digital signal, thereby generating a digitally corrected signal;

digital calibration means for generating a digital calibration signal which corresponds to said digitally corrected signal in response to said first and third clock signals;

adding means for adding said digitally corrected signal and said digital calibration signal, thereby generating a digitally compensated signal;

output means for processing said digitally compensated signal in response to said first clock signal and generating a final converted digital signal; and control means for generating said first, second and third clock signals such that, during a calibration value calculation operation, said digitally compensated signal has a higher resolution than an output signal during a normal operation.

12. An analog-to-digital converter according to claim 11, wherein said digital calibration means performs a round-off operation on said compensated signal when storing and using said compensated signal.

13. An analog-to-digital converter according to claim 11, wherein a two-stage conversion process is performed during the normal operation of the converter, and a three-stage conversion process is performed during the calibration value calculating operation of the converter.

14. An analog-to-digital converter according to claim 11, wherein said digital calibration means includes:

third selection means for selecting either an upper portion of said digitally corrected signal or said control signal provided from said control means in response to said third clock signal;

an address decoder for decoding a signal selected by said third selection means and generating an address signal;

a memory device for storing a digitally compensated value at the address determined by said address signal in response to a write control signal, and reading out a digitally compensated value stored therein in response to a read control signal;

first round-off means for rounding off a digitally compensated signal from said adding means and providing a rounded digitally compensated value to the memory;

a latch for latching said rounded digitally compensated value read out from said memory;

an inverter for inverting an output signal of said latch;

a register for storing said digitally compensated signal from said adding means in response to said first clock signal; and fourth selection means for selecting either an output signal from said inverter or an output signal from said first register in response to said third clock signal.

15. A method of operating a digitally compensated analog-to-digital converter comprising:

performing a normal conversion process, thereby generating a first digital signal;

performing an additional conversion process, thereby generating a second digital signal; and combining the first digital signal with the second digital signal, thereby generating a calibration value having a higher resolution than the first digital signal generated by the normal conversion process.

16. A method according to claim 15 further including rounding the calibration value.

17. A method according to claim 15 further including storing the calibration value in a memory device.

18. A method according to claim 15 wherein:

performing a normal conversion process includes performing a two-stage conversion; and performing an additional conversion process includes performing a third-stage conversion.

19. A method according to claim 15 further including:

performing a normal conversion process, thereby generating a digital signal; and subtracting the calibration value from the digital signal, thereby generating a calibrated digital signal.

20. A method according to claim 15 further including generating and accumulating error values of elements in a digital-to-analog converter.

21. A digitally compensated analog-to-digital converter system comprising:

a variable resolution analog-to-digital converter for converting an analog signal to a digital signal by performing multiple conversions on the analog signal, wherein the resolution of the digital signal is determined by the number of conversions the analog-to-digital converter performs on the analog signal;

a calibration circuit coupled to the analog-to-digital converter for calculating a calibration value based on the digital signal during a calibration value calculation operation; and an adder coupled between the analog-to-digital converter and the calibration circuit for combining the digital signal and calibration value, thereby generating a compensated digital signal;

wherein the analog-to-digital converter performs a first number of conversions on the analog signal during normal operation, thereby generating a digital signal having a first resolution; and wherein the analog-to-digital converter performs a second number of conversions greater than the first number on the analog signal during a calibration value calculation operation, thereby generating a digital signal having a second resolution that is greater than the first resolution.

22. A system according to claim 21 wherein the calibration circuit converts the digital signal to the calibration value by rounding the digital signal.

* * * * *